United States Patent
Takada

(10) Patent No.: US 9,627,428 B2
(45) Date of Patent: Apr. 18, 2017

(54) IMAGE SENSOR AND ELECTRONIC DEVICE

(71) Applicant: CANON KABUSHIKI KAISHA, Tokyo (JP)

(72) Inventor: Toshiyuki Takada, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

(21) Appl. No.: 14/625,238

(22) Filed: Feb. 18, 2015

(65) Prior Publication Data
US 2015/0236063 A1  Aug. 20, 2015

(30) Foreign Application Priority Data

Feb. 19, 2014  (JP) .................................. 2014-029963
Nov. 27, 2014  (JP) .................................. 2014-240368

(51) Int. Cl.
*H01L 27/00*  (2006.01)
*H01L 27/146*  (2006.01)

(52) U.S. Cl.
CPC .. *H01L 27/14634* (2013.01); *H01L 27/14612* (2013.01); *H01L 27/14636* (2013.01); *H01L 27/14643* (2013.01)

(58) Field of Classification Search
CPC ......... H01L 27/14634; H01L 27/14636; H01L 27/1469
See application file for complete search history.

(56) References Cited

U.S. PATENT DOCUMENTS

2015/0229861 A1*  8/2015  Yakemoto ......... H01L 27/14634
                                                                348/300

FOREIGN PATENT DOCUMENTS

| JP | 2008-211220 A | 9/2008 |
| JP | 2008-235478 A | 10/2008 |
| JP | 2009-170448 A | 7/2009 |
| JP | 2010-225927 A | 10/2010 |

* cited by examiner

*Primary Examiner* — Thanh Luu
(74) *Attorney, Agent, or Firm* — Cowan, Liebowitz & Latman, P.C.

(57) ABSTRACT

An image sensor includes a first semiconductor chip, a second semiconductor chip and connecting portions configured to connect the first semiconductor chip and the second semiconductor chip. The first semiconductor chip includes a photoelectric conversion portion, a capacitor, a reset transistor, and an amplification transistor. The second semiconductor chip includes a transfer transistor, and a row selecting transistor. The connecting portions connect the photoelectric conversion portion to the transfer transistor, the transfer transistor to the capacitor, and the amplification transistor to the row selecting transistor respectively.

12 Claims, 7 Drawing Sheets

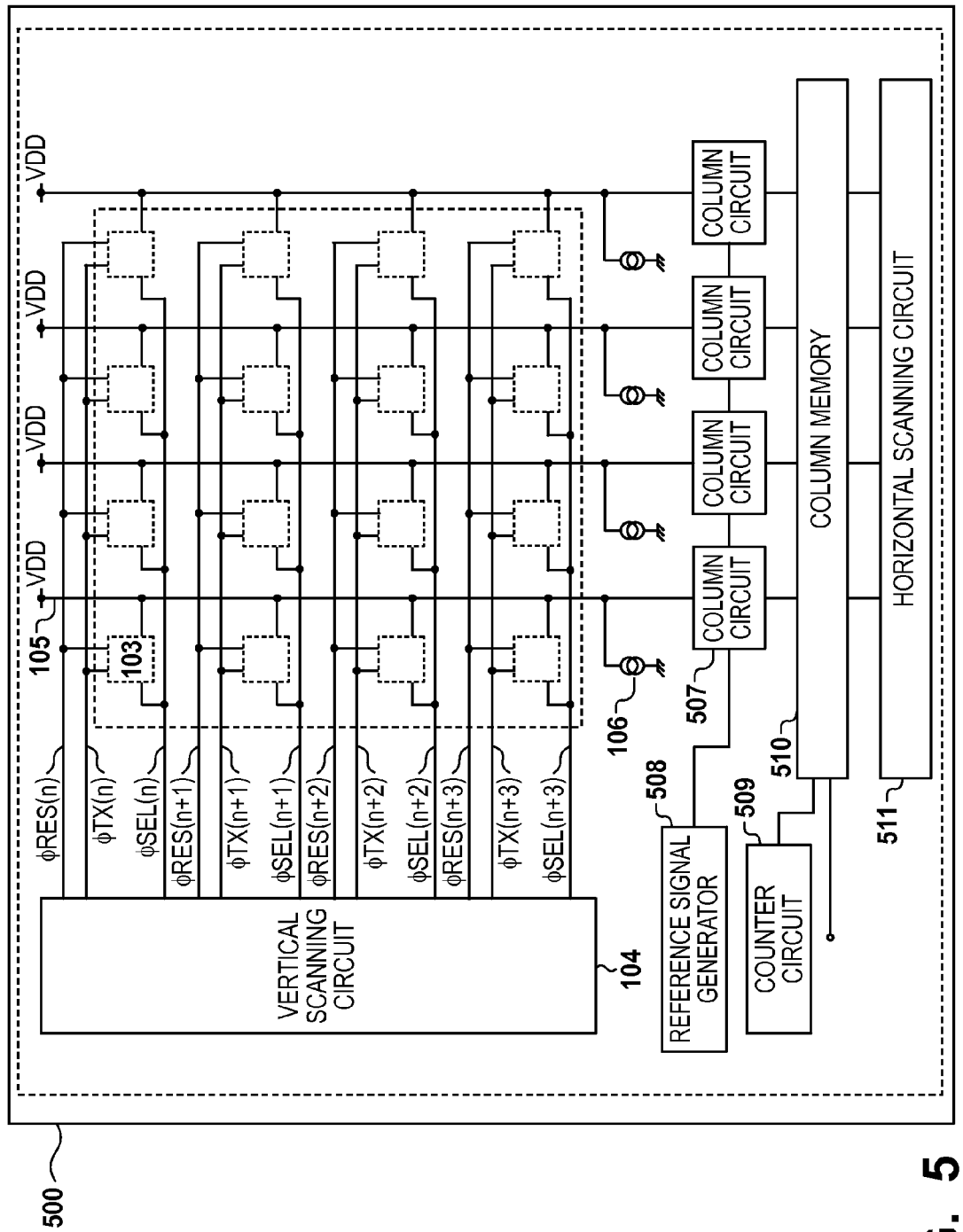
F I G. 5

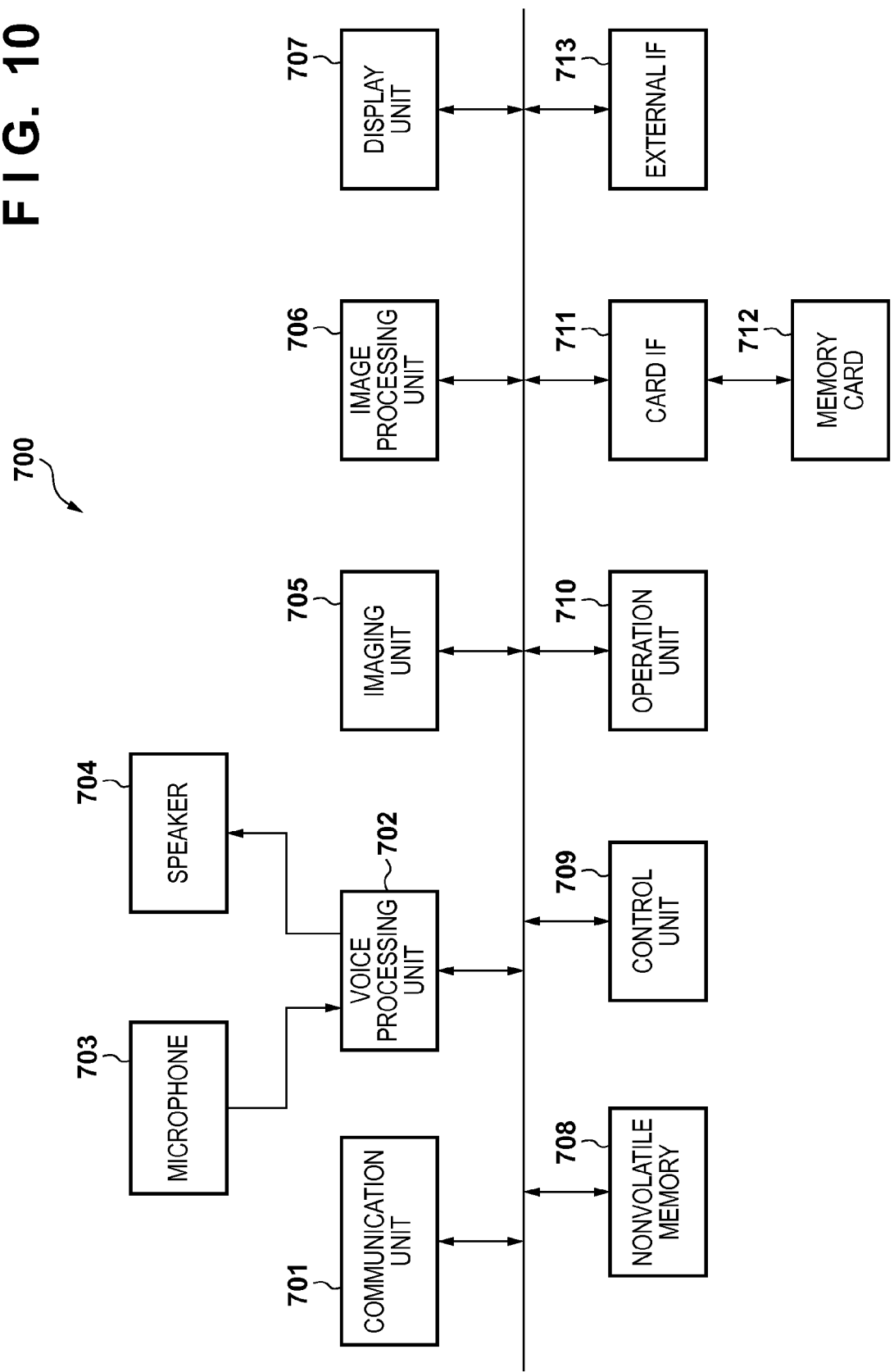

IMAGE SENSOR AND ELECTRONIC DEVICE

BACKGROUND OF THE INVENTION

Field of the Invention

The present invention relates to an image sensor and an electronic device using the same.

Description of the Related Art

In an image sensor such as a CMOS (Complementary Metal Oxide Semiconductor) image sensor, generally, as the area of the photoelectric conversion portion of a pixel becomes large, the light receiving amount increases, and the S/N ratio improves. However, since a plurality of control transistors are formed in the periphery of the photoelectric conversion portion of the pixel, the light receiving area per unit pixel cannot be increased. Additionally, in an imaging apparatus such as a digital camera or a digital video camera, when the number of pixels of the image sensor is increased to shoot a high-resolution image, the light receiving area per unit pixel reduces. For this reason, the image quality may degrade because the S/N ratio lowers.

On the other hand, a stacked image sensor has been proposed recently in which two semiconductor chips, that is, a CMOS image sensor chip and a signal processing chip are integrated into one package. For example, Japanese Patent Laid-Open No. 2010-225927 proposes an image sensor in which a pixel including a photodiode and a plurality of control transistors is formed on a first chip, and a driving circuit for driving the pixel is formed on a second chip.

SUMMARY OF THE INVENTION

According to one aspect of the present invention, there is provided an image sensor comprising a first semiconductor chip, a second semiconductor chip, and a plurality of connecting portions configured to connect the first semiconductor chip and the second semiconductor chip, wherein the first semiconductor chip includes a photoelectric conversion portion, a capacitor configured to hold charges generated by the photoelectric conversion portion, a reset transistor configured to control reset of the charges in the photoelectric conversion portion and the capacitor, and an amplification transistor configured to amplify signal charges in the capacitor and convert the signal charges into a signal voltage, the second semiconductor chip includes a transfer transistor configured to control transfer of the charges generated by the photoelectric conversion portion to the capacitor, and a row selecting transistor configured to control connection of an output of the amplification transistor to a column output line, and the connecting portions connect the photoelectric conversion portion to the transfer transistor, the transfer transistor to the capacitor, and the amplification transistor to the row selecting transistor respectively.

Further features of the present invention will become apparent from the following description of exemplary embodiments (with reference to the attached drawings).

BRIEF DESCRIPTION OF THE DRAWINGS

FIG. 5 is a block diagram showing an example of the arrangement of an image sensor according to the second embodiment of the present invention;

FIG. 10 is a block diagram showing an example of an electronic device according to the sixth embodiment of the present invention.

DESCRIPTION OF THE EMBODIMENTS

Exemplary embodiments of the present invention will now be described in detail with reference to the accompanying drawings.

First Embodiment

Figure 1:
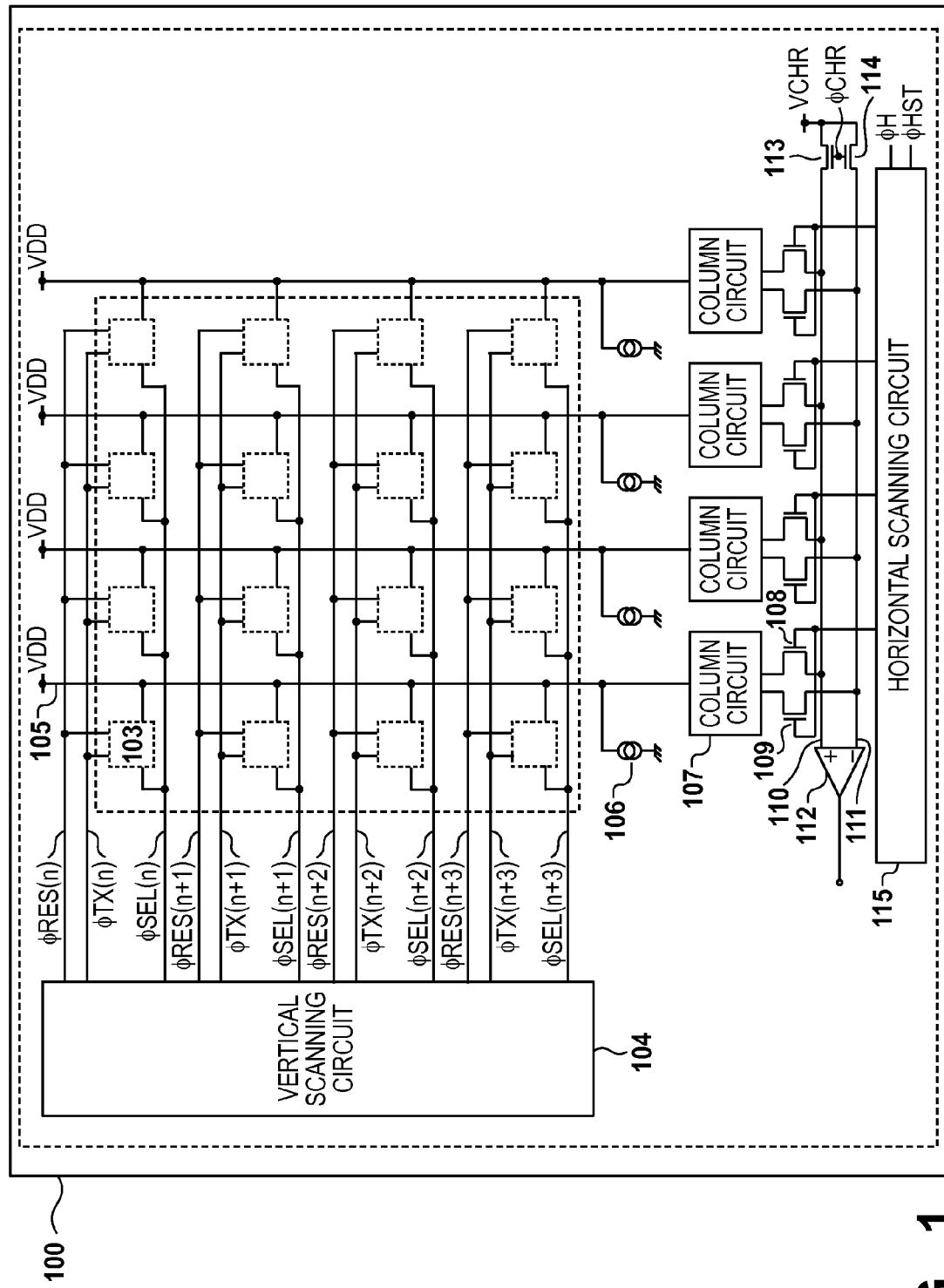
FIG. 1 is a block diagram showing an example of the arrangement of an image sensor according to the first embodiment of the present invention.
Figure 2:
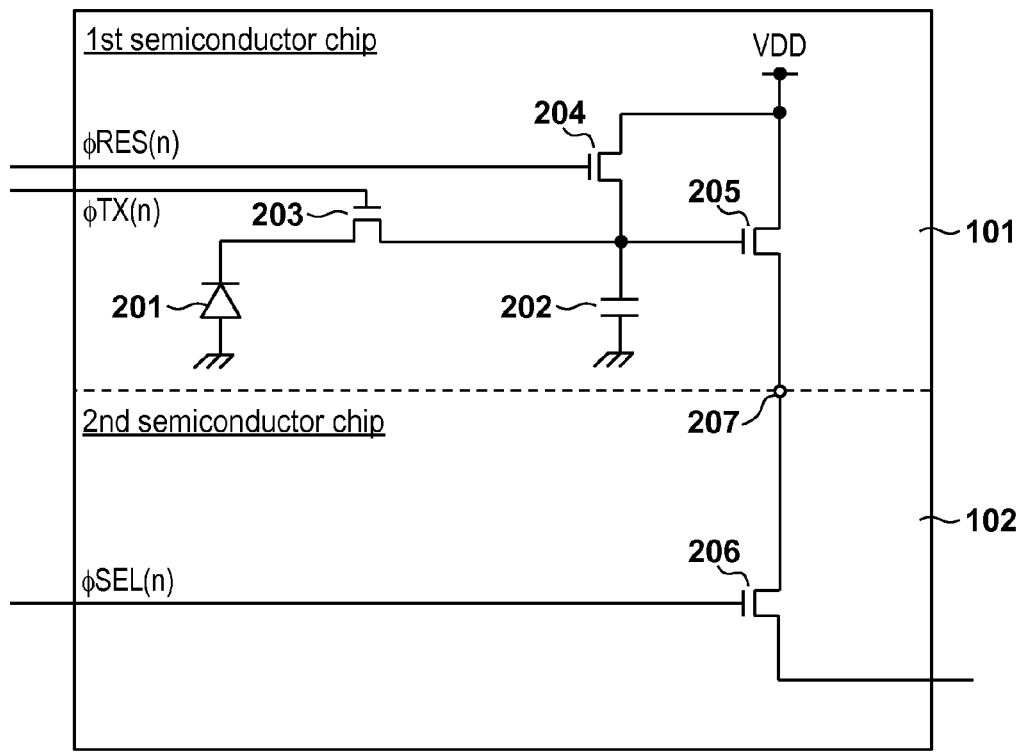
FIG. 2 is a circuit diagram showing an example of the pixel of the image sensor according to the first embodiment of the present invention.

FIG. 1 is a block diagram showing an example of the arrangement of an image sensor according to the first embodiment of the present invention. An image sensor 100 is formed from a first semiconductor chip 101, a second semiconductor chip 102, and a connecting portion 207 to be described later. The image sensor 100 is formed by an arrangement that stacks the first semiconductor chip 101 and the second semiconductor chip 102. Pixels 103 are arranged in matrix on the first semiconductor chip 101. Here, the image sensor is assumed to include 4×4 pixels 103 for the descriptive convenience. FIG. 2 shows an example of the pixel. The pixel 103 includes a photoelectric conversion portion 201, a capacitor 202 that functions as a floating diffusion, a transfer transistor 203, and a reset transistor 204. The pixel also includes an amplification transistor 205 and a row selecting transistor 206. The photoelectric conversion portion 201 generates signal charges corresponding to incident light and stores them. The transfer transistor 203 controls transfer of the signal charges generated by the photoelectric conversion portion 201 to the capacitor 202. The reset transistor 204 resets the signal charges generated by the photoelectric conversion portion 201 and stored in the capacitor 202. The amplification transistor 205 amplifies the signal charges stored in the capacitor 202 and converts them into a signal voltage. The row selecting transistor 206 controls connection of the output of the amplification transistor 205 to a column output line 105.

In this embodiment, some of the circuits of the pixel 103 are formed on the first semiconductor chip 101, and the remaining circuits and peripheral circuits are formed on the second semiconductor chip 102. The circuits on the first semiconductor chip 101 and those on the second semiconductor chip 102 are connected by the connecting portion 207. In this embodiment, the photoelectric conversion portion 201, the capacitor 202, the transfer transistor 203, the reset transistor 204, and the amplification transistor 205 are arranged on the first semiconductor chip. The row selecting transistor 206 is arranged on the second semiconductor chip. The output of the amplification transistor 205 is output to the row selecting transistor 206 on the second semiconductor chip via the connecting portion 207.

The operation of the image sensor 100 will be described with reference to FIG. 1 that illustrates the arrangement example of the image sensor and FIG. 4 that illustrates the drive timing. A vertical scanning circuit 104 supplies signals $\phi TX(n)$, $\phi RES(n)$, and $\phi SEL(n)$ and selects a predetermined row of the pixels, thereby controlling read of signal charges of photoelectric conversion portions. The plurality of pixels 103 arranged along a column output line 105 are connected to each column output line 105. The column output line 105 is connected to a column circuit 107 prepared for each column output line 105. A load current source 106 drives, via the column output line 105, the amplification transistor 205 of a row selected by the row selecting transistor 206.

Figure 3:
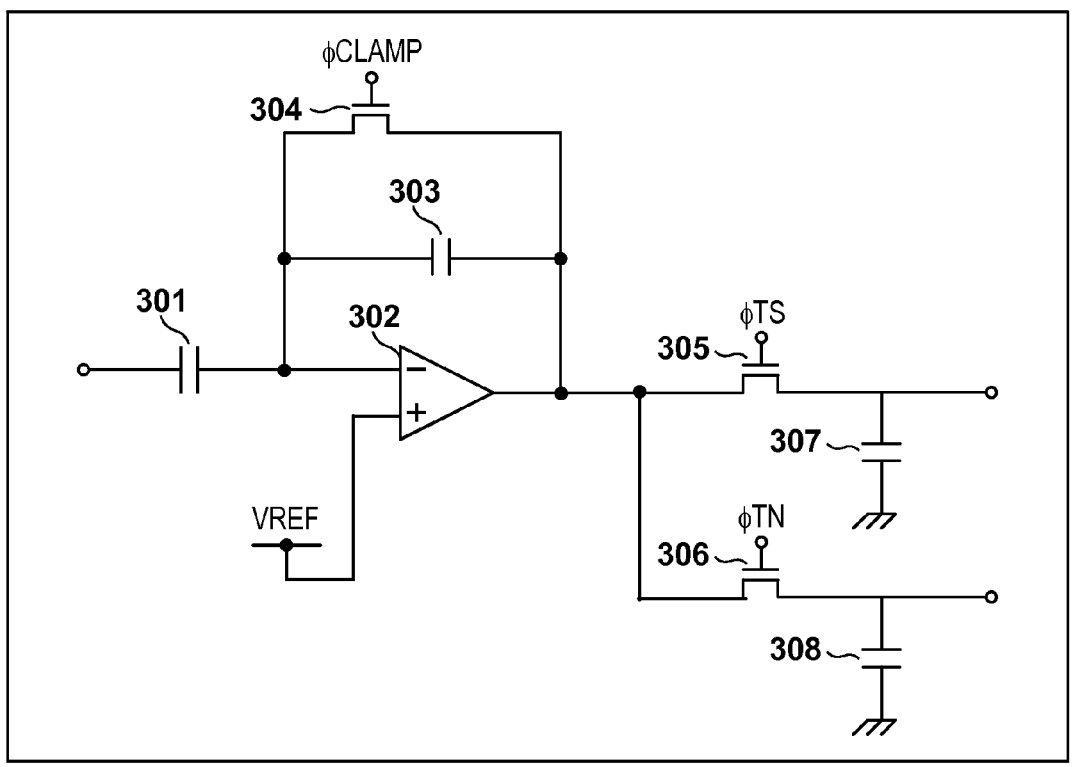
FIG. 3 is a circuit diagram showing an example of the arrangement of the column circuit of the image sensor according to the first embodiment of the present invention.

FIG. 3 illustrates the circuit arrangement of the column circuit 107. The column output line 105 is connected to the inverting input terminal of an inverting amplifier 302 via a clamp capacitance 301 provided in the column circuit 107. The amplification factor of the inverting amplifier 302 is determined by the ratio of the clamp capacitance 301 and a feedback capacitance 303. In addition, a clamp transistor 304 that is on/off-controlled by a signal $\phi CLAMP$ given by a CPU (not shown) is connected to the inverting input terminal and the output terminal of the inverting amplifier 302. A reference voltage VREF is input to the noninverting input terminal of the inverting amplifier 302. An imaging signal amplified by a predetermined gain of the inverting amplifier 302 is stored in storage capacities 307 and 308 via transfer transistors 305 and 306. Note that the transfer transistors 305 and 306 are respectively on/off-controlled by signals $\phi TS$ and $\phi TN$ given by a timing generator (TG) (not shown).

The column circuit 107 is sequentially selected and scanned by a horizontal scanning circuit 115 based on a signal $\phi HST$ given by the timing generator (TG) and supplied to a horizontal scanning circuit 115. When the scanning starts, the imaging signal stored in the storage capacity 307 is sequentially output to a horizontal output line 110 via a column selecting transistor 108 that is on/off-controlled by a signal $\phi H$. The column circuit 107 is similarly scanned by the signal $\phi H$ supplied from the horizontal scanning circuit 115. The imaging signal stored in the storage capacity 308 is sequentially output to a horizontal output line 111 via a column selecting transistor 109 that is on/off-controlled by the signal $\phi H$. Note that the horizontal output lines 110 and 111 are reset to a voltage VCHR for each clock of the signal $\phi H$ by reset transistors 113 and 114 that are on/off-controlled by a signal $\phi CHR$. A differential amplifier 112 amplifies the difference between signal voltages output to the horizontal output lines 110 and 111 by a predetermined amplification factor and outputs the difference. When the signal is sequentially read from the column circuit 107 to the horizontal scanning circuit 115, an image signal of one row is obtained.

Figure 4:
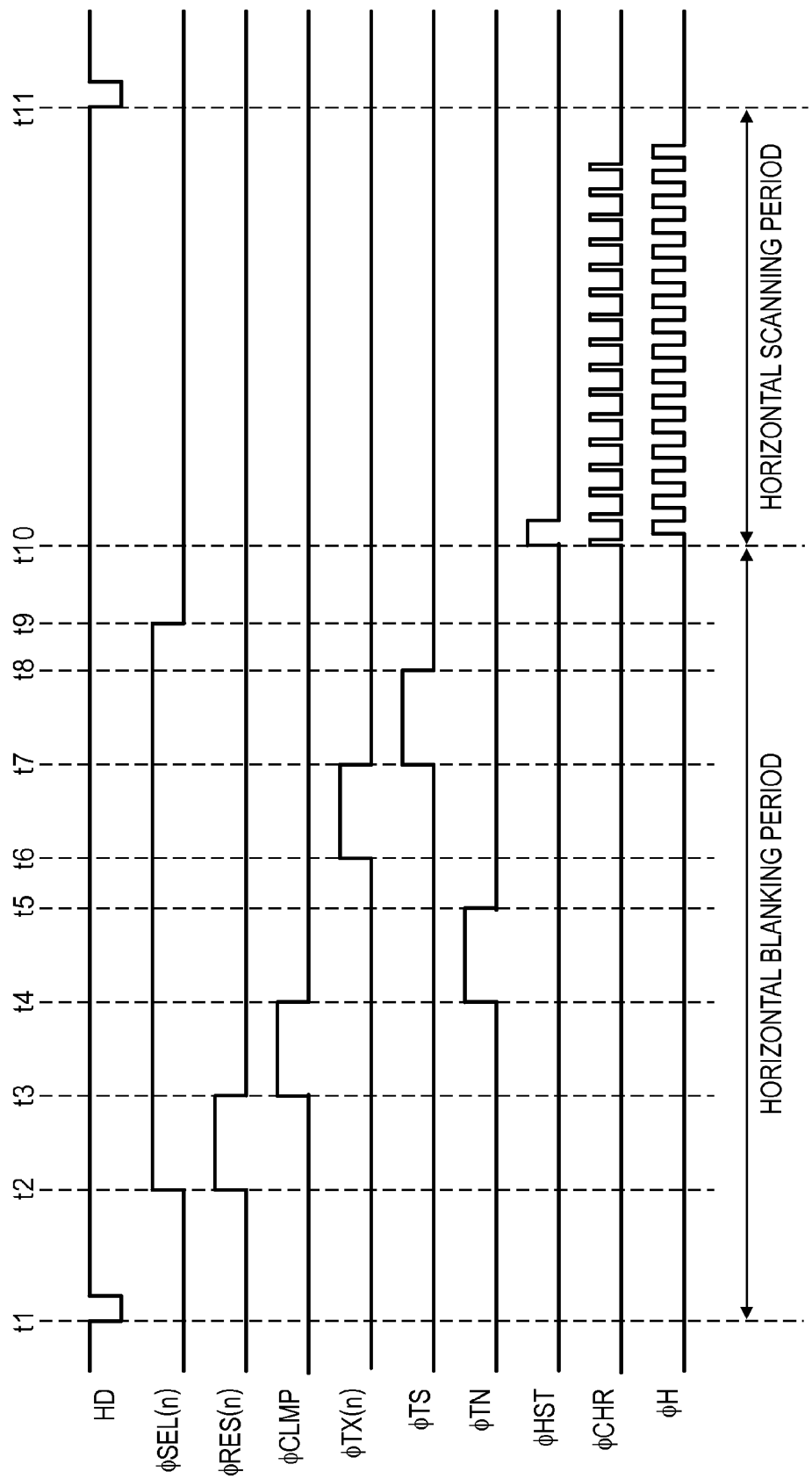
FIG. 4 is a timing chart showing the drive timing in one horizontal period according to the first embodiment of the present invention.

FIG. 4 is a timing chart showing an example of the drive timing in one horizontal scanning period when reading charges from the pixel 103 in the arrangement shown in FIG. 1. Each signal shown in FIG. 4 takes one of a High state (to be referred to as "H") and a Low state (to be referred to as "L"). A signal HD represents one horizontal scanning period. The signal $\phi HST$ represents the start of read in the horizontal scanning period, that is, the start of read of output signals on a column basis to the horizontal output lines 110 and 111 controlled by the horizontal scanning circuit 115. The period from time t1 at which the signal HD changes to "L" to time t10 at which the signal $\phi HST$ changes to "H" is a period during which the signals of the pixels 103 corresponding to one row are read, and the read signals of the one row are transferred to and stored in the storage capacities 307 and 308 of the column circuit 107.

A read operation for pixels arranged on the nth row out of the pixels 103 arranged in matrix will be described below. For the descriptive convenience, "signal SEL of nth row" will be referred to as "signal $\phi SEL(n)$". For the remaining drive signals as well, (n) represents the nth row. At time t2, the signal $\phi SEL(n)$ changes to "H". The row selecting transistor 206 is thus turned on, and the signals of the pixels 103 of the nth row are output to the column output line 105. At the same time, the signal $\phi RES(n)$ changes to "H". The reset transistor 204 is thus turned on, and charges stored in the capacitor 202 are reset. When the signal $\phi RES(n)$ changes to "L" at time t3, the reset transistor 204 is turned off, and the reset of charges in the capacitor 202 ends. At the same time, the signal $\phi CLAMP$ changes to "H" to turn on the clamp transistor 304. The current signal level of the column output line 105 is thus clamped to the clamp capacitance 301. At time t4, the signal $\phi CLAMP$ changes to "L". The clamp transistor 304 is thus turned off, and clamp of the signal level of the column output line 105 to the clamp capacitance 301 ends. After the end of clamp to the clamp capacitance 301 at the time t4, the difference signal between the current signal level of the column output line 105 and the signal level of the column output line 105 clamped to the clamp capacitance 301 from the times t3 to t4 is amplified by a predetermined amplification factor and output. At the time t4, the signal $\phi TN$ changes to "H" to turn on the transfer transistor 306. A noise signal component is output from the inverting amplifier 302 and transferred to and stored in the storage capacity 308.

When the signal $\phi TN$ changes to "L" at time t5, the transfer transistor 306 is turned off, and storage in the storage capacity 308 ends. At time t6, the signal $\phi TX$ changes to "H" to turn on the transfer transistor 203, and signal charges stored in the photoelectric conversion portion 201 are transferred to the capacitor 202. At time t7, the signal $\phi TX$ changes to "L" to turn off the transfer transistor 203, and signal charge storage in the capacitor 202 ends. At the same time, the signal $\phi TS$ changes to "H", and the transfer transistor 305 is turned on. At this time, the signal charges in the capacitor 202 of the pixel 103 are amplified and converted into a voltage by the amplification transistor 205 and output to the column output line 105. The output signal is transferred to and stored in the storage capacity 307 via the clamp capacitance 301 and the inverting amplifier 302. When the signal $\phi TS$ changes to "L" at time t8, the transfer transistor 305 is turned off, and storage in the storage capacity 307 ends. At time t9, the signal $\phi SEL(n)$ changes to "L" to turn off the row selecting transistor 206, and the read from the pixels 103 of the nth row ends.

The horizontal scanning period starts from the time t10, during which the signals of the nth row stored in the storage capacities 307 and 308 are read. Input of the signal $\phi H$ to the horizontal scanning circuit 115 starts, and the column selecting transistors 108 and 109 connected to each column circuit 107 are sequentially turned on in accordance with the signal $\phi H$. The signals stored in the storage capacities 307 and 308 are output to the horizontal output lines 110 and 111, respectively. The differential amplifier 112 subtracts the noise component from the horizontal output line 111 from the imaging signal from the horizontal output line 110, and then amplifies the signal by the predetermined amplification factor. The differential amplifier 112 sequentially outputs the image signal of one row.

According to the above-described arrangement, the row selecting transistor 206 is arranged on the second semiconductor chip 102. This can ensure a margin for the space on the first semiconductor chip 101 and increase the light receiving area of the photoelectric conversion portion 201. That is, if the number of pixels does not change, the quantity of incident light per unit pixel increases, and a large signal amplitude is obtained. It is therefore possible to obtain an image having a high S/N ratio. In addition, the area of the image sensor can be reduced by tightening the space. According to this embodiment, the connecting portion 207 is provided at the output of the amplification transistor 205. Since an amplified imaging signal is input to the second semiconductor chip 102 via the connecting portion 207, the influence of noise on the imaging signal can be reduced. Since no parasitic capacitance caused by the wiring to the capacitor 202 is added, the influence of the parasitic capacitance on the signal charges obtained from the photoelectric conversion portion 201 is small. When the peripheral circuits are arranged on the second semiconductor chip, the area of the photoelectric conversion portion can be reserved.

Second Embodiment

Not only the arrangement of the image sensor shown in FIG. 1 but also an arrangement using a so-called column AD converter shown in FIG. 5 can obtain the same effects as described above. This will be described below with reference to FIG. 5. The same reference numerals as in FIG. 1 described above denote the same portions, and a detailed description thereof will be omitted.

Figure 6:
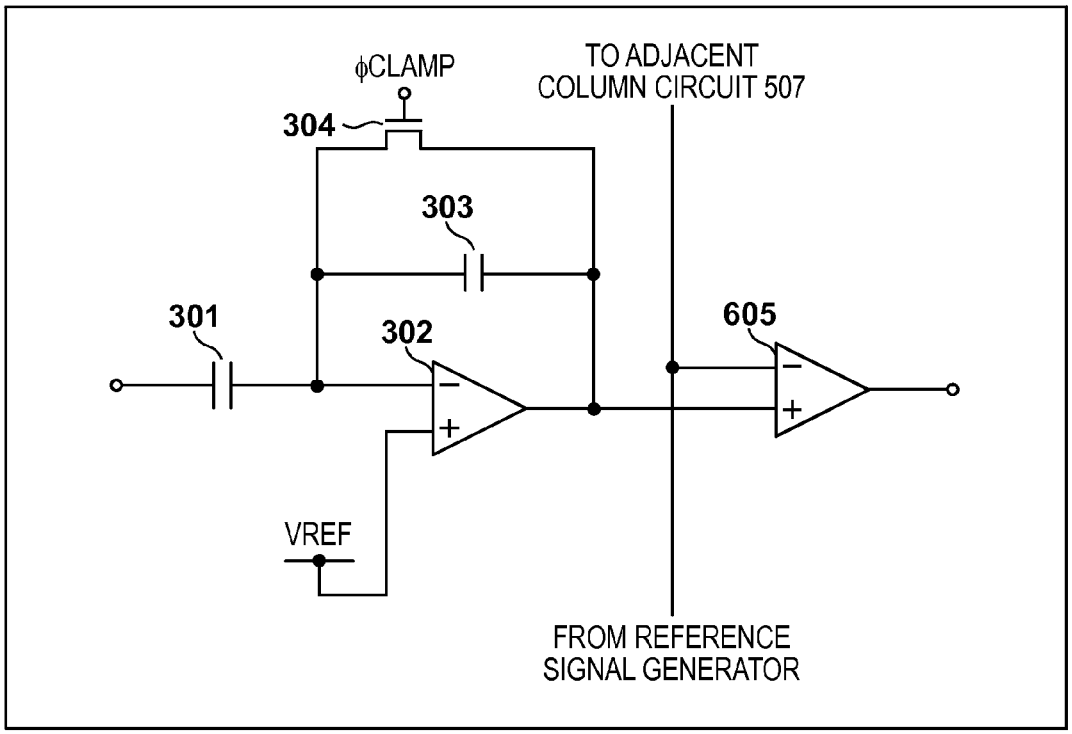
FIG. 6 is a circuit diagram showing an example of the arrangement of the column circuit of the image sensor according to the second embodiment of the present invention.

Unlike the above-described image sensor 100, an image sensor 500 shown in FIG. 5 provides an analog/digital (AD) converter on a second semiconductor chip 102, and includes a so-called column AD converter that performs AD conversion on a column basis in the image sensor. FIG. 6 shows the arrangement of a column circuit 507 in FIG. 5. The same reference numerals as in FIG. 3 described above denote the same portions, and a detailed description thereof will be omitted. An imaging signal amplified by a predetermined gain of an inverting amplifier 302 is input to a comparison circuit 605. The imaging signal input to the comparison circuit 605 is compared with a reference signal that is input from a reference signal generator 508 and gradually increases. The reference signal generator 508 supplies a common reference signal to all column circuits 507. A counter circuit 509 supplies a count value to a column memory 510. In accordance with the comparison result of the comparison circuit 605, the column memory 510 holds, as the digital value of the imaging signal, the count value of the counter circuit 509 at a timing at which the output of the comparison circuit 605 has changed. When the digital value held by the column memory 510 is selected by a horizontal scanning circuit 511 and sequentially read on a column basis, an image signal of one row is obtained.

Third Embodiment

Figure 7:
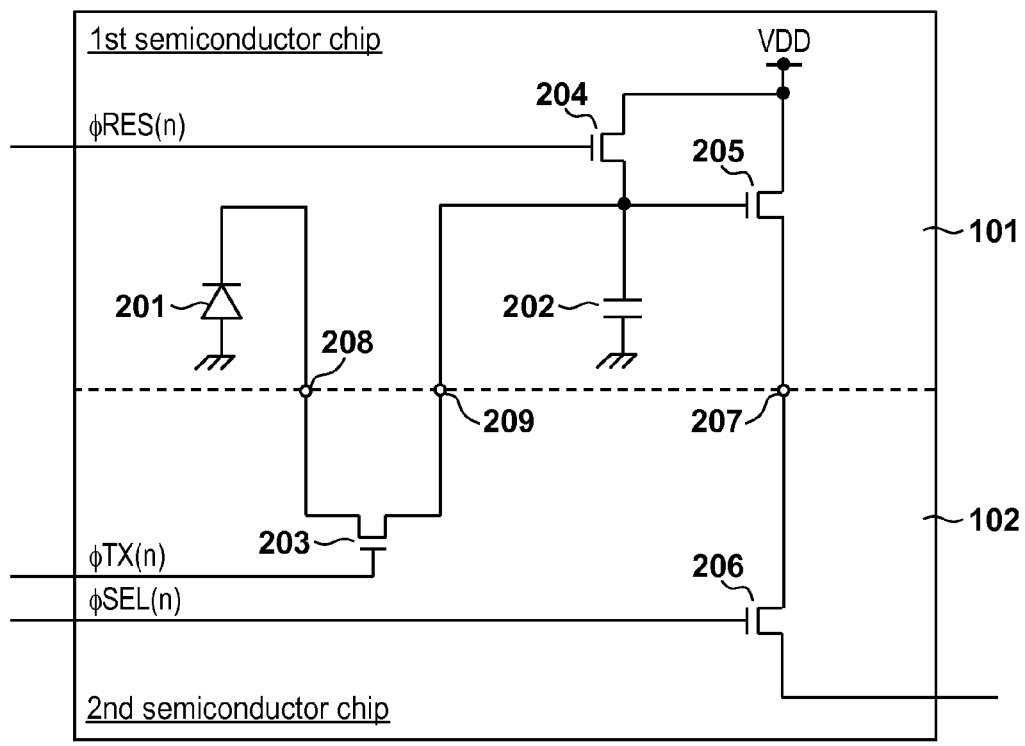
FIG. 7 is a circuit diagram showing an example of the pixel of an image sensor according to the third embodiment of the present invention.

Another arrangement capable of reserving a wide light receiving area of a photoelectric conversion portion will be described with reference to FIG. 7. FIG. 7 illustrates the circuit arrangement of a pixel 103 formed on a first semiconductor chip 101 and a second semiconductor chip 102. The dotted line indicates the boundary portion between the first semiconductor chip 101 and the second semiconductor chip 102. In this embodiment, an image sensor 100 or 500 is formed from a first semiconductor chip 101, a second semiconductor chip 102, and connecting portions 207, 208 and 209. In FIG. 7, a photoelectric conversion portion 201, a capacitor 202, a reset transistor 204, and an amplification transistor 205 are formed on the first semiconductor chip 101, and a transfer transistor 203 and a row selecting transistor 206 are formed on the second semiconductor chip 102.

The photoelectric conversion portion 201 generates signal charges corresponding to incident light and stores them. The transfer transistor 203 controls transfer of the signal charges stored in the photoelectric conversion portion 201 to the capacitor 202. The signal charges obtained by the photoelectric conversion portion 201 are input to the second semiconductor chip 102 via the connecting portion 208 and then input from the transfer transistor 203 of the second chip to the capacitor 202 of the first semiconductor chip 101 via the connecting portion 209 and held. The reset transistor 204 controls reset of the signal charges stored in the photoelectric conversion portion 201 and the capacitor 202. The amplification transistor 205 amplifies the signal charges stored in the capacitor 202 and converts them into a signal voltage. The output of the amplification transistor 205 is output to the row selecting transistor 206 of the second semiconductor chip via the connecting portion 207. The row selecting transistor 206 controls connection of the output of the amplification transistor 205 to a column output line 105. The subsequent procedure until the signal output from the pixel 103 to the column output line 105 is output to the outside of the image sensor is the same as in the first embodiment, and a detailed description thereof will be omitted.

According to the above arrangement, it is possible to reserve a wide light receiving area of the photoelectric conversion portion 201 on the first semiconductor chip 101. If the number of pixels does not change, a large signal amplitude can be obtained by increasing the quantity of incident light per unit pixel. It is therefore possible to obtain an image having a high S/N ratio. On the other hand, since the transfer transistor is arranged on the second semiconductor chip 102, the parasitic capacitance to the capacitor 202 increases. However, the arrangement according to this embodiment is advantageous when it is necessary to increase the amount of signal charges obtained by increasing the light receiving area of the photoelectric conversion portion 201.

Fourth Embodiment

Figure 8:
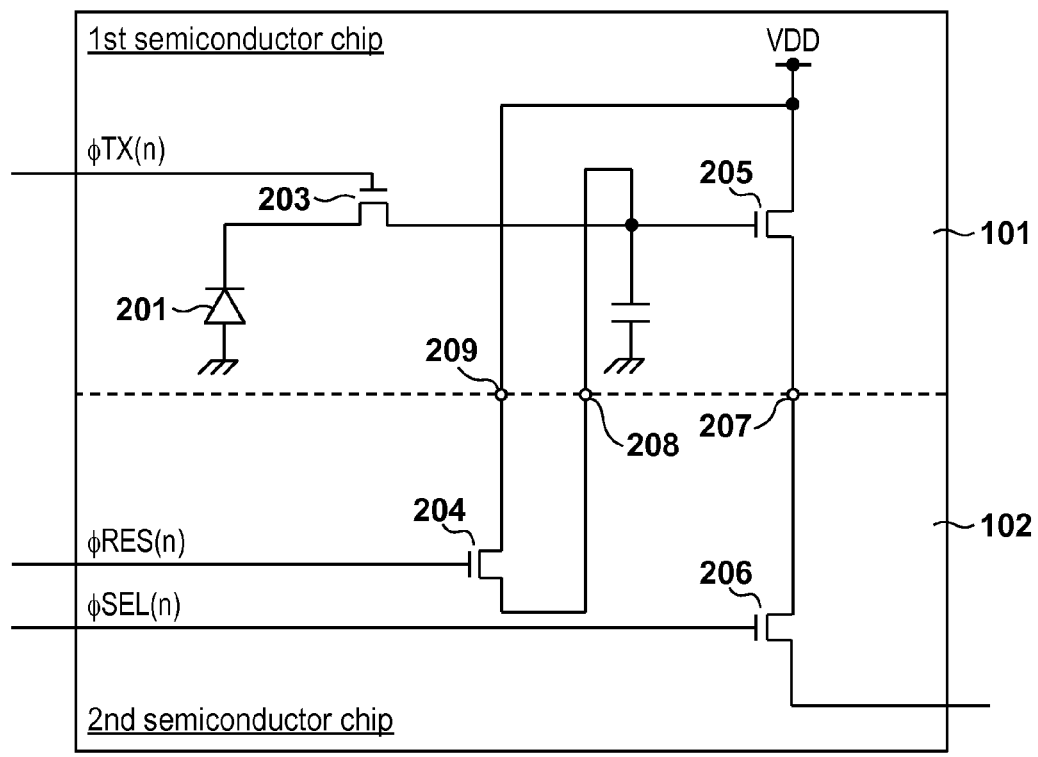
FIG. 8 is a circuit diagram showing an example of the pixel of an image sensor according to the fourth embodiment of the present invention.

In this embodiment, as shown in FIG. 8, a reset transistor 204 and a row selecting transistor 206 are arranged on a second semiconductor chip 102. The reset transistor 204 is connected to a power supply voltage VDD and the node between a transfer transistor 203, a capacitor 202, and the gate electrode of an amplification transistor 205. The output of the amplification transistor 205 and the row selecting transistor 206 are connected via a connecting portion 207. In this embodiment as well, since the connecting portion 207 is provided on the output side of the amplification transistor 205, the influence of the connecting portion 207 on an imaging signal is small.

Fifth Embodiment

Figure 9:
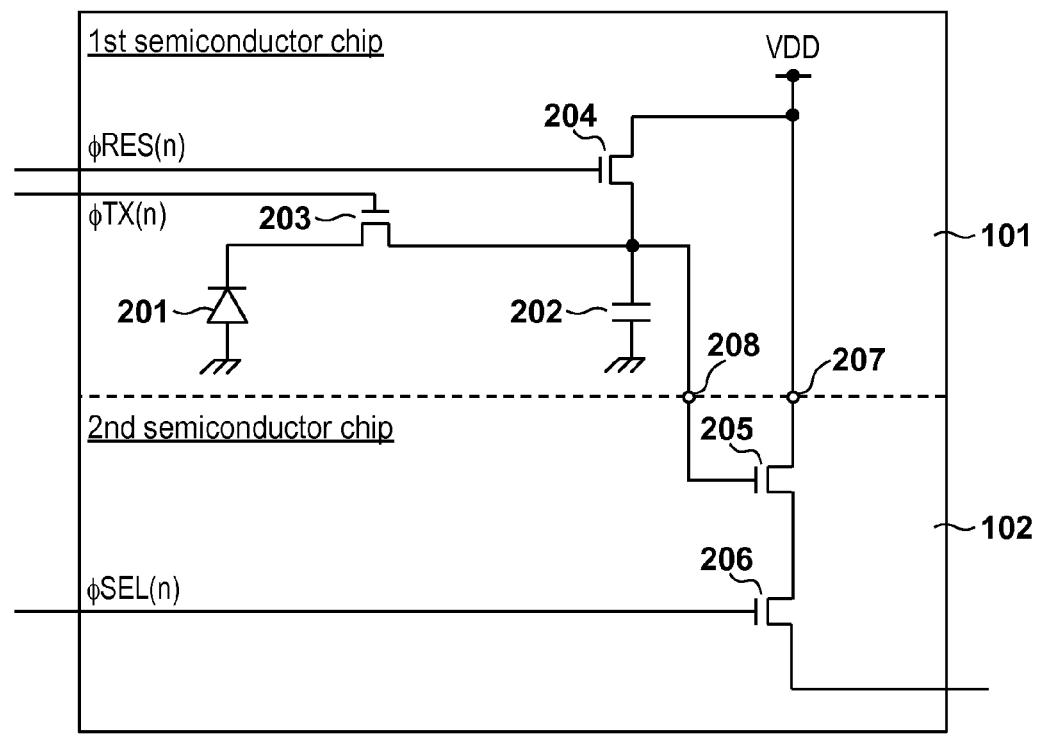
FIG. 9 is a circuit diagram showing an example of the pixel of an image sensor according to the fifth embodiment of the present invention.

In this embodiment, as shown in FIG. 9, an amplification transistor 205 and a row selecting transistor 206 are arranged on a second semiconductor chip 102. The gate electrode of the amplification transistor 205 is connected to the node between a transfer transistor 203, a capacitor 202, and a reset transistor 204. Since the amplification transistor 205 is arranged on the second semiconductor chip, the transistor as a heat source can be spaced apart from a pixel 103. This arrangement is advantageous because the influence of heat on an imaging signal can be reduced.

Sixth Embodiment

An embodiment in which one of the above-described image sensors is applied to an electronic device will be described next using a portable telephone as an example. FIG. 10 is a block diagram showing the arrangement of a portable telephone 700 according to this embodiment. The portable telephone 700 according to this embodiment has an email function, an Internet connection function, an image shooting/reproduction function, and the like as well as a speech communication function. Referring to FIG. 10, a communication unit 701 communicates voice data or image data with another telephone by a communication method complying with the communication carrier to which the user has subscribed. At the time of speech communication, a voice processing unit 702 converts voice data from a microphone 703 into a format suitable for calling and sends it to the communication unit 701. The voice processing unit 702 also decodes voice data of the communication partner sent from the communication unit 701 and sends it to a speaker 704. An image sensor according to the present invention is used as the image sensor of an imaging unit 705. That is, the imaging unit 705 includes one of the image sensors described in the first to fifth embodiments, and shoots an object image and outputs image data. At the time of image shooting, an image processing unit 706 processes image data shot by the imaging unit 705, converts it into a format suitable for recording, and outputs it. When reproducing a recorded image, the image processing unit 706 processes the reproduced image and sends it to a display unit 707. The display unit 707 includes a liquid crystal display panel of several inches, and displays various kinds of screens in accordance with an instruction from a control unit 709. A nonvolatile memory 708 stores data such as the information of an address book, email data, and image data shot by the imaging unit 705.

The control unit 709 includes a CPU, a memory, and the like, and controls the units of the portable telephone 700 in accordance with a control program stored in the memory (not shown). An operation unit 710 includes a power button, number keys, and various kinds of operation keys used by the user to input data. A card interface (IF) 711 records or reproduces various data on or from a memory card 712. An external interface (IF) 713 transmits data stored in the nonvolatile memory 708 or the memory card 712 to an external device or receives data transmitted from the external device. The external IF 713 performs communication by a known communication method, for example, wired communication such as USB or wireless communication.

The speech communication function of the portable telephone 700 will be described next. When calling a communication partner, the user inputs the telephone number of the communication partner by operating the number keys of the operation unit 710, or displays, on the display unit 707, the address book stored in the nonvolatile memory 708, selects the communication partner, and instructs calling. When origination is instructed, the control unit 709 causes the communication unit 701 to call the communication partner. When the communication partner receives the incoming call, the communication unit 701 outputs the voice data of the partner to the voice processing unit 702, and also transmits the voice data of the user to the partner.

When transmitting email, the user instructs mail creation using the operation unit 710. When mail creation is instructed, the control unit 709 displays a mail creation screen on the display unit 707. The user inputs a transmission destination address and a text and instructs transmission using the operation unit 710. When mail transmission is instructed, the control unit 709 sends the information of the address and the data of the mail text to the communication unit 701. The communication unit 701 converts the mail data into a format suitable for communication and transmits it to the transmission destination. Upon receiving email, the communication unit 701 converts the data of the received mail into a format suitable for display and displays it on the display unit 707.

The shooting function of the portable telephone 700 will be described next. When the user sets the shooting mode and then instructs to shoot a still image or moving image by operating the operation unit 710, the imaging unit 705 shoots still image or moving image and sends still image data or moving image data to the image processing unit 706. The image processing unit 706 processes the shot still image data or moving image data and stores it in the nonvolatile memory 708. The image processing unit 706 also sends the shot still image data or moving image data to the card IF 711. The card IF 711 stores the still image or moving image data on the memory card 712.

The portable telephone 700 can transmit a file including the thus shot still image or moving image data as an attached file of email. More specifically, when transmitting email, the user selects an image file stored in the nonvolatile memory 708 or the memory card 712 and instructs transmission of the attached file.

The portable telephone 700 can also transmit a file including the shot still image or moving image data to an external device such as a PC or another telephone via the external IF 713. The user selects an image file stored in the nonvolatile memory 708 or the memory card 712 and instructs transmission by operating the operation unit 710. The control unit 709 controls the external IF 713 to read out the selected image file from the nonvolatile memory 708 or the memory card 712 and transmit it to the external device. A portable telephone has been exemplified above. The image sensor according to the present invention can advantageously be used particularly in a portable electronic device such as a portable telephone required to have a small image sensor because the photoelectric conversion portion can have a wide area with respect to the chip area. The image sensor can be used not only in the portable electronic device but also in a digital camera, a smartphone, a notebook PC, a tablet terminal, or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-029963, filed Feb. 19, 2014, and No. 2014-240368 filed Nov. 27, 2014 which are hereby incorporated by reference herein in their entirety.

What is claimed is:
1. An image sensor comprising:
a first semiconductor chip;

a second semiconductor chip; and a plurality of connecting portions configured to connect the first semiconductor chip and the second semiconductor chip, wherein the first semiconductor chip includes a photoelectric conversion portion, a capacitor configured to hold charges generated by the photoelectric conversion portion, a reset transistor configured to control reset of the charges in the photoelectric conversion portion or the capacitor, and an amplification transistor configured to amplify signal charges in the capacitor and convert the signal charges into a signal voltage, the second semiconductor chip includes a transfer transistor configured to control transfer of the charges generated by the photoelectric conversion portion to the capacitor, and a row selecting transistor configured to control connection of an output of the amplification transistor to a column output line, and the connecting portions connect the photoelectric conversion portion to the transfer transistor, the transfer transistor to the capacitor, and the amplification transistor to the row selecting transistor respectively.

2. The sensor according to claim 1, wherein the second semiconductor chip comprises a column circuit connected to the column output line.

3. The sensor according to claim 1, wherein the second semiconductor chip comprises a vertical scanning circuit configured to drive a pixel.

4. The sensor according to claim 2, wherein the second semiconductor chip comprises a horizontal scanning circuit configured to sequentially select the column circuit and output an output of the column circuit.

5. The sensor according to claim 2, wherein the column circuit comprises:
a reference signal generator configured to generate a reference signal;
a comparison circuit configured to compare the reference signal with a signal from the column output line and invert an output in accordance with a comparison result;
a counter circuit configured to output a count value; and
a column memory provided on a column basis and configured to hold the count value when the output of the comparison circuit has been inverted.

6. An electronic device comprising:
an imaging unit including an image sensor of claim 1; and
an image processing unit configured to process a signal from the imaging unit.

7. An image sensor comprising:
a first semiconductor chip;
a second semiconductor chip; and a plurality of connecting portions configured to connect the first semiconductor chip and the second semiconductor chip, wherein the first semiconductor chip includes a photoelectric conversion portion, a capacitor configured to hold charges generated by the photoelectric conversion portion, a transfer transistor configured to control transfer of the charges generated by the photoelectric conversion portion to the capacitor, and a amplification transistor configured to amplify signal charges in the capacitor and convert the signal charges into a signal voltage, the second semiconductor chip includes a reset transistor configured to control reset of the charges in the photoelectric conversion portion or the capacitor, and a row selecting transistor configured to control connection of an output of the amplification transistor to a column output line, and the connecting portions connect a node between the transfer transistor, the capacitor, and the amplification transistor to the reset transistor, the reset transistor to a power supply voltage, and the amplification transistor to the row selecting transistor respectively.

8. The sensor according to claim 7, wherein the second semiconductor chip comprises a column circuit connected to the column output line.

9. The sensor according to claim 7, wherein the second semiconductor chip comprises a vertical scanning circuit configured to drive a pixel.

10. The sensor according to claim 8, wherein the second semiconductor chip comprises a horizontal scanning circuit configured to sequentially select the column circuit and output an output of the column circuit.

11. The sensor according to claim 8, wherein the column circuit comprises:
a reference signal generator configured to generate a reference signal;
a comparison circuit configured to compare the reference signal with a signal from the column output line and invert an output in accordance with a comparison result;
a counter circuit configured to output a count value; and
a column memory provided on a column basis and configured to hold the count value when the output of the comparison circuit has been inverted.

12. An electronic device comprising:
an imaging unit including an image sensor of claim 7; and
an image processing unit configured to process a signal from the imaging unit.

* * * * *